United States Patent
Pendleton et al.

(10) Patent No.: US 6,862,644 B1
(45) Date of Patent: Mar. 1, 2005

(54) BACKPLANE ARCHITECTURE FOR A TELECOMMUNICATIONS SYSTEM CHASSIS

(75) Inventors: Matthew A. Pendleton, Cedar Park, TX (US); Peter J. Renucci, Austin, TX (US); Ronald D. Lutz, Jr., Round Rock, TX (US); Anthony H. Anconetani, Round Rock, TX (US)

(73) Assignee: General Bandwidth Inc., Austin, TX (US)

( * ) Notice: Subject to any disclaimer, the term of this patent is extended or adjusted under 35 U.S.C. 154(b) by 379 days.

(21) Appl. No.: 10/079,461

(22) Filed: Feb. 21, 2002

Related U.S. Application Data
(60) Provisional application No. 60/289,304, filed on May 7, 2001.

(51) Int. Cl.[7] .............................................. G06F 13/00
(52) U.S. Cl. ...................... 710/305; 710/301; 361/683; 455/347; 370/910; 379/900
(58) Field of Search .................. 710/305, 300–302, 710/307, 62, 72; 709/250, 253; 361/683–686, 748, 752; 455/347, 507; 370/216, 257, 910; 379/350, 908, 900; 712/33

(56) References Cited

U.S. PATENT DOCUMENTS

| | | | | |
|---|---|---|---|---|
| 4,945,201 A | * | 7/1990 | Ito et al. ........................ 219/110 |
| 5,331,632 A | * | 7/1994 | Aaron et al. ................... 370/376 |
| 5,987,620 A | * | 11/1999 | Tran ............................... 713/600 |
| 6,188,912 B1 | * | 2/2001 | Struhsaker et al. ............ 455/561 |
| 6,731,741 B1 | * | 5/2004 | Fourcand et al. ......... 379/221.08 |
| 6,748,477 B1 | * | 6/2004 | Benson et al. ................. 710/305 |

OTHER PUBLICATIONS

"IEEE standard backplane bus specification for multiprocessor architectures: Futurebus" by Technical Committee on Microprocessors and Microcomputers of the IEEE Computer Society, USA (abstract only).*

"Experimental research on a hot swappable bus system" by Yamada, T.; Kaminaga, Y.; Kurosawa, K.; Ohashi, A.; Masui, K. (abstract only).*

* cited by examiner

Primary Examiner—Gopal C. Ray
(74) Attorney, Agent, or Firm—Baker Botts L.L.P.

(57) ABSTRACT

A backplane (11) of a telecommunications chassis includes a pair of controller slots that can receive respective controller modules. The backplane (11) also has a plurality of module slots that can receive respective telephony modules. Each of the pair of controller slots is connected by a plurality of buses to each of the plurality of module slots. The backplane (11) provides the ability to place any module type into any of the plurality of module slots.

10 Claims, 26 Drawing Sheets

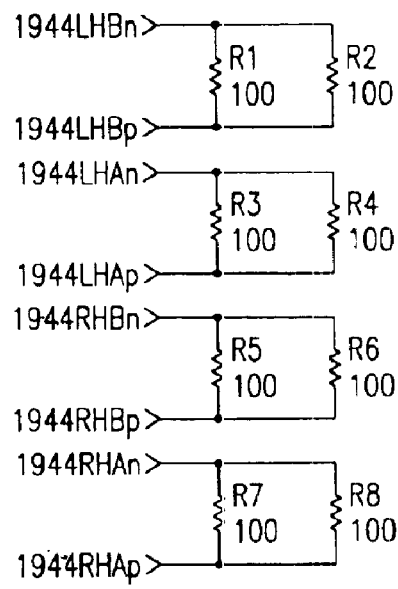
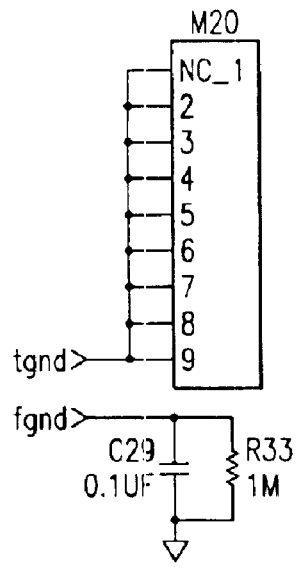
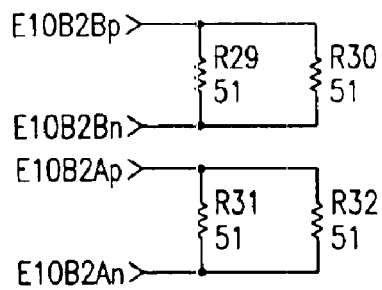
*FIG. 5H-1*

US 6,862,644 B1

BACKPLANE ARCHITECTURE FOR A TELECOMMUNICATIONS SYSTEM CHASSIS

RELATED APPLICATIONS

This application claims the benefit of U.S. Provisional Application Ser. No. 60/289,304 filed May 7, 2001.

TECHNICAL FIELD OF THE INVENTION

The present invention relates in general to telecommunications system equipment and more particularly to a backplane architecture for a telecommunications system chassis.

BACKGROUND OF THE INVENTION

The backplane of a telecommunications chassis provides an interconnection capability among the functional modules within the chassis. The architecture of a backplane affects various factors of operation for a piece of equipment in a telecommunications network. These factors include efficiency, scalability, and reliability. For efficiency purposes, the architecture of the backplane determines how a signal is to traverse and be routed across the backplane. The number of buses used in accomplishing a certain task also has an effect on the efficiency of the backplane. For scalability purposes, the architecture of the backplane determines how many modules may be supported within a chassis or string of chassis and how they are connected in relation to each other. The backplane architecture for a piece of telecommunications equipment determines the number of telephone calls that may be simultaneously supported. The sharing of buses and the signal transfer over each bus also has an effect on the scalability of the backplane. For reliability purposes, the architecture of the backplane determines the sparing capability of the telecommunications equipment in order to continue to provide operation in the event of a failure. Conventional backplane architectures do not effectively enhance each of these three factors. Therefore, it is desirable to provide a backplane architecture with improved efficiency, scalability and reliability characteristics.

SUMMARY OF THE INVENTION

From the foregoing, it may be appreciated by those skilled in the art that a need has arisen for a backplane architecture that creates an efficient, reliable, and scalable network element within a telecommunications network. In accordance with the present invention, a backplane architecture for a telecommunications system chassis is provided that substantially eliminates or greatly reduces disadvantages and problems associated with conventional backplane architectures for telecommunications equipment.

According to an embodiment of the present invention, there is provided a backplane architecture for a telecommunications system chassis that includes a pair of controller slots operable to receive respective controller modules. The backplane architecture also includes a plurality of module slots that are operable to receive respective telecommunications modules. Each of the pair of controller slots is connected to each of the plurality of module slots by a plurality of buses. This configuration allows for any module to be placed into any module slot of the backplane architecture with continued operation capability.

The present invention may provide various technical advantages over conventional backplane architectures for telecommunications equipment. For example, one technical advantage may include the ability to provide a backplane architecture that can accept any telecommunications module in any module slot. Another technical advantage may include providing a sparing bus for the plurality of module slots in response to failure or removal of a module. Yet another technical advantage may include providing an efficient, scalable, and reliable piece of telecommunications equipment within a telecommunications network. Other technical advantages may be readily ascertainable by those skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

FIGS. 5A–I illustrate schematic diagrams of buses within the backplane architecture.

DETAILED DESCRIPTION OF THE INVENTION

Figure 1:
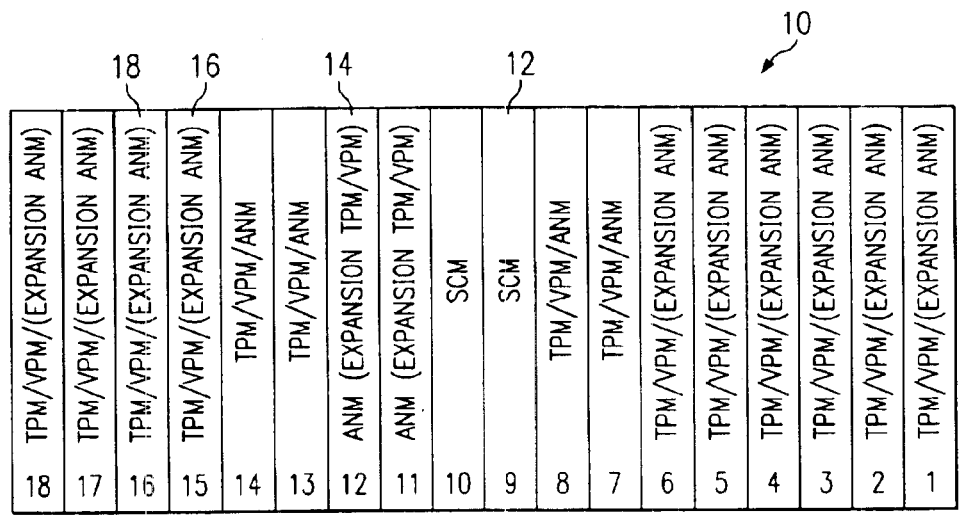
FIG. 1 illustrates a simplified block diagram of a telecommunications chassis.

FIG. 1 is a block diagram of a physical placement of modules within a telecommunications chassis 10. There are various types of modules that may be connected to the front side of a backplane of telecommunications chassis 10. These modules include a system controller module 12, an access network module 14, a telephony port module 16, and a voice processing module 18. System controller module 12 may provides a central processor, a switching matrix, and timing functions. Access network module 14 provides access to a broadband network, for example an asynchronous transfer mode network and an Internet Protocol network, and may be used for a subtending connection to another telecommunications chassis. Telephony port module 16 provides access to a narrowband network, for example with a T1, E1, STS-1, and plain old telephone service (POTS) interface. Voice processing module 18 provides high density voice compression. On the backside of the backplane of telecommunications chassis 10, there may be a cable interface module 20 to provide the T1 interface connections in conjunction with telephony port module 16.

Figure 2A:
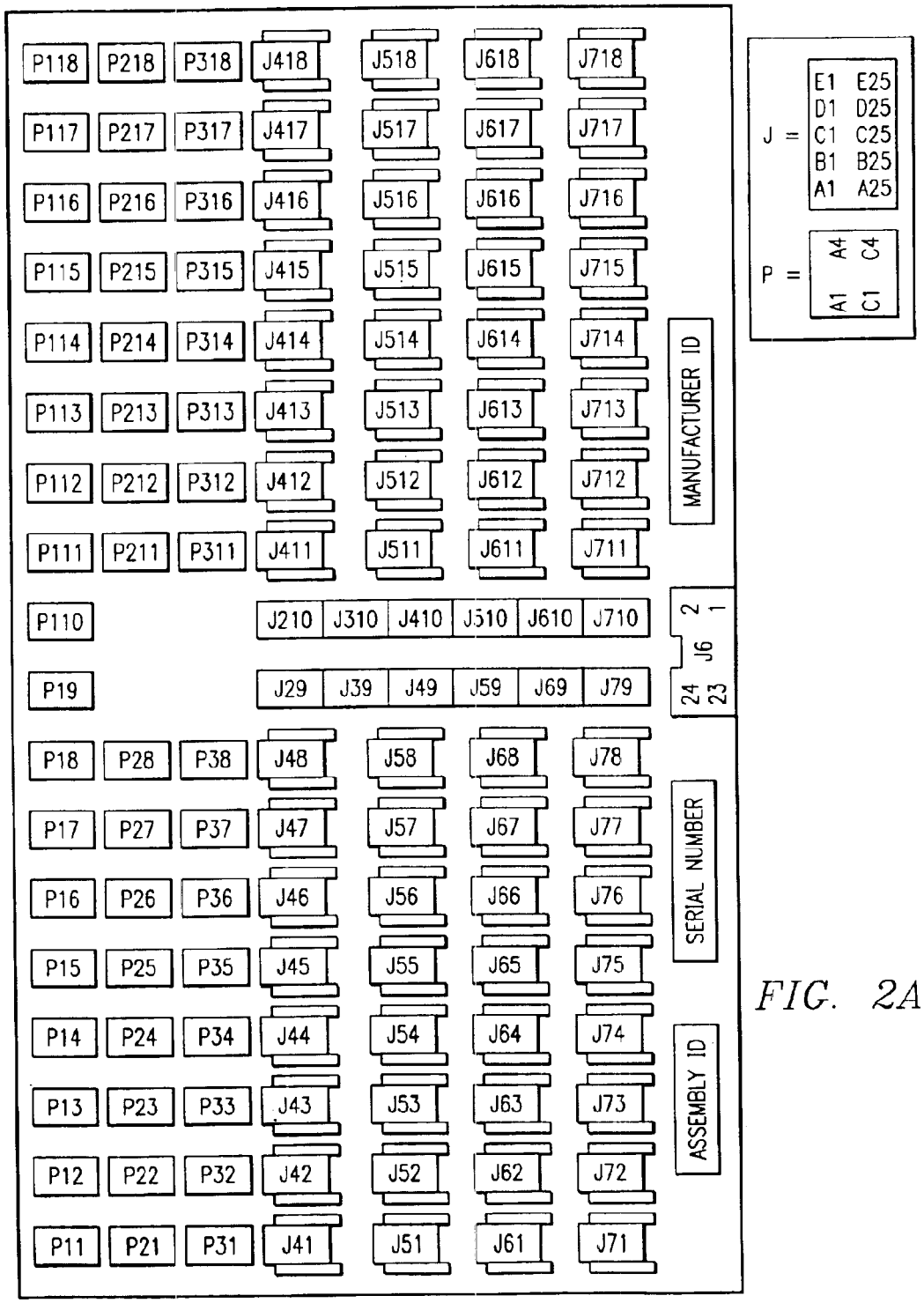
FIGS. 2A–B illustrate a schematic diagram of connectors for each slot of the backplane architecture.
Figure 2B:
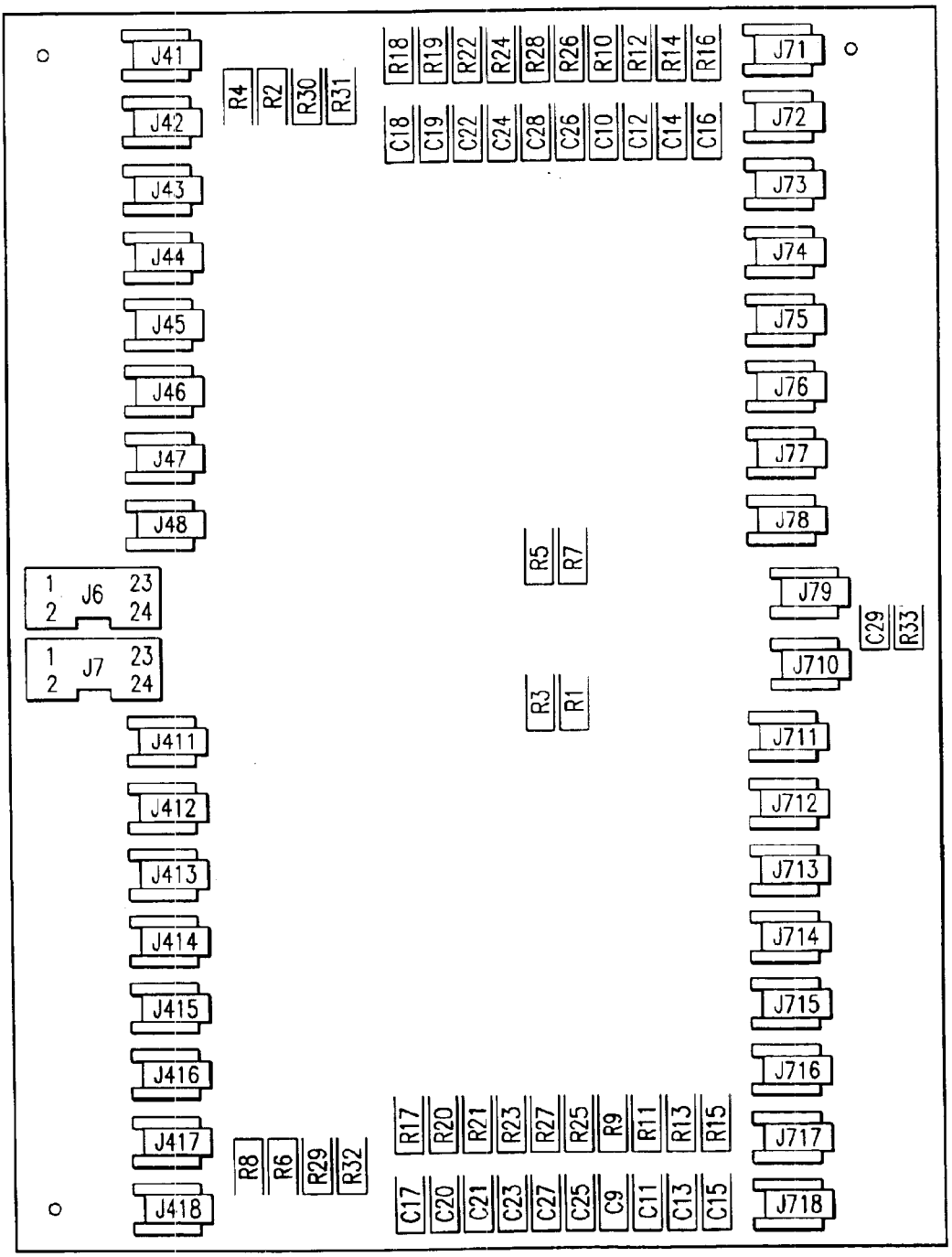

FIGS. 2A–B show the connectors for each slot of a backplane 11 of telecommunications chassis 10. FIG. 2A shows the connectors on the front side of backplane 11. FIG. 2B shows the connectors on the back side of backplane 11. Each module slot within telecommunications chassis 10 has a unique slot number and backplane identification in order to physically pinpoint a specific module. Redundant system controller modules are specifically wired for slots 9 and 10 connections on the backplane. Slots 1 to 8 and 11 to 18 are wired on the backplane to interface with any of access network modules, telephony port modules, and voice processing modules. In this manner, the backplane of telecommunications chassis 10 provides an any card, any slot configuration capability. The backplane of telecommunications chassis 10 also provides an adjacent slot protection switching capability. For example, slots 3 and 4 have cross connections to each other to provide backup functionality for common type modules within those two slots.

Figure 3:
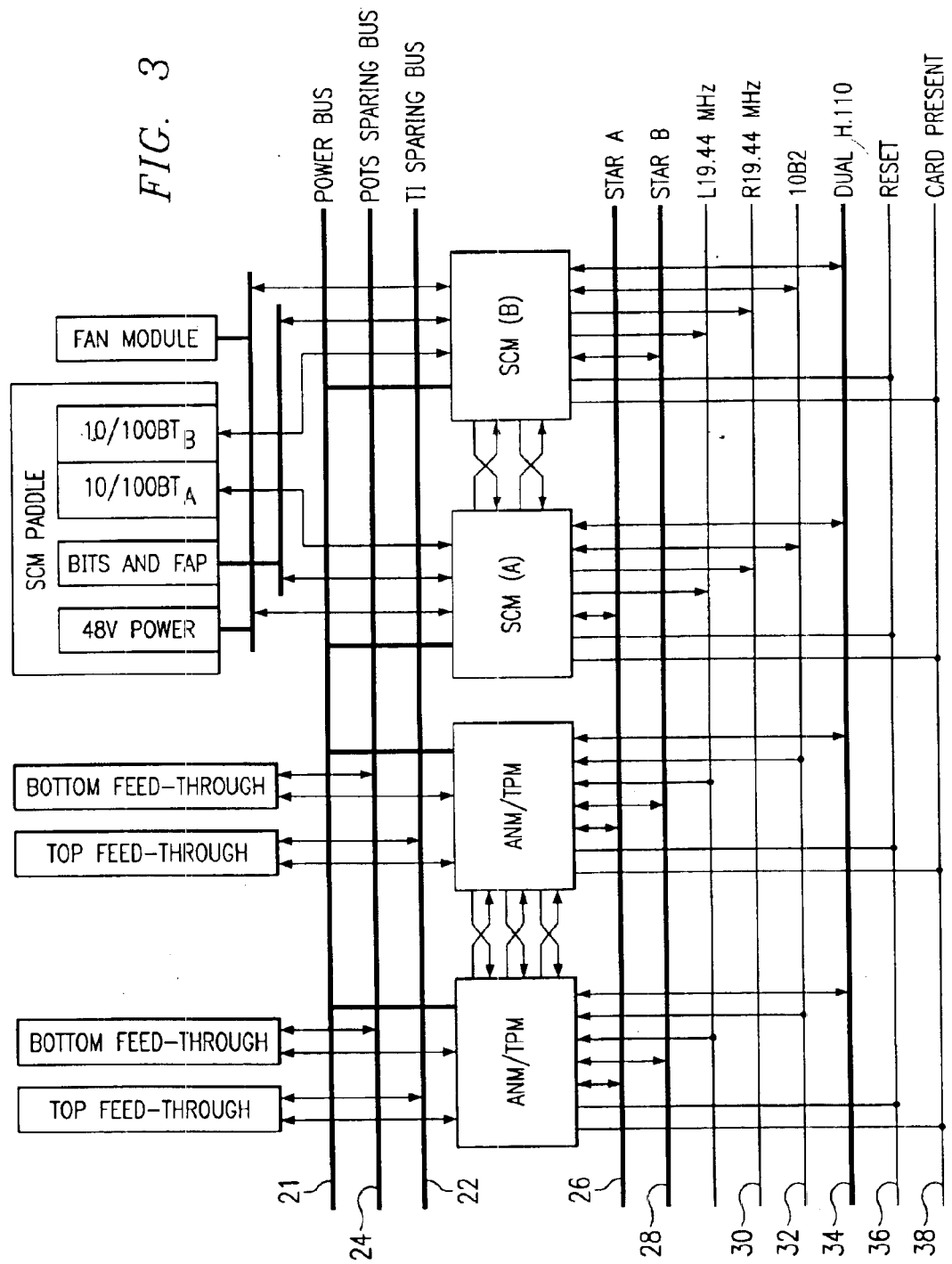
FIG. 3 illustrates a simplified block diagram of a backplane architecture for the telecommunications chassis.

FIG. 3 shows the connectivity between modules provided by the backplane of telecommunications chassis 10. Various buses are supported by this backplane. These buses include a power bus 21; a T1 sparing bus 22, a POTS sparing bus 24, star bus A 26, star bus B 28, clock distribution bus 30, ethernet bus 32, a dual H.110 bus 34, and a reset bus 36. There are also signal lines between adjacent slots as introduced above for data crossover, inter-slot communication, and inter-slot handshaking. Signal lines are present between system controller module slots for inter-slot communication and inter-slot handshaking. Slots 9 and 10 are linked together to provide each with status and information in the event of a failure in one of system controller modules 12 in either slot 9 or 10. Two signals from each system controller module 12 are bussed from slots 9 and 10 to all other slots in order to indicate which of the system controller modules is the current active controller for telecommunications chassis 10.

Power bus 21 provides 48 volt power signals (−48A, −48B, and 48RT) redundantly implemented. There is also a TALK power signal providing analog talk power to the telephony port modules. A RING power signal is for the telephone ringing supply. For reset bus 36, individual reset lines are routed from each system controller module 12 to all other slots in telecommunications chassis 10 in order to allow for independent hardware resets to any installed module. The active system controller module 12 controls the resetting of installed modules in telecommunications chassis 10. Card present bus 38 includes inputs from each slot to each system controller module 12. Each system controller module 12 has a pull-up resistor on each input line and, as a card is inserted in telecommunications chassis 10, the line becomes grounded to indicate the presence of a module in the slot. System controller module 12 determines the type of module inserted into a slot through interrogation of the installed module.

Each module identifies its position within telecommunications chassis 10 by a slot identification. The slot identification is a five bit value implemented at each slot. Backplane 11 connects slot signals provided by each module and digital ground to the five bit slot identification in order to represent the value of the slot number for the particular module. Frame ground encases backplane 11 on its outer layers and makes its connection to telecommunications chassis 10 through its mounting holes. A frame ground signal is connected at the outermost connectors of backplane 11 in order to bring frame ground to every module. A transient ground pin is connected to a pin on the lowest connector of every slot. Transient ground pins are routed over the backplane directly to a mounting stud near the bottom backside of backplane 11.

Backside electrical input/output is connected through top and bottom feed through connectors of front side slots 1–8 and 11–18 to cable interface modules 20 on the back side of backplane 11. These back side connectors carry a sparing bus, relay control, LED control, module identification, module present, and power. System controller module 12 controls the relay control, LED control, and power signals. The relay control signals drive the sparing relays on cable interface modules 20. The LED control signals turn on LED indicators on cable interface modules 20. The LED control signals may be a differential pair that may be reversed bias to get an alternate color on a bi-colored LED indicator. The module identification signal for a back side cable interface module 20 is provided to the corresponding front side module.

Feed through connections from slots 9 and 10 used for system controller modules 12 to corresponding back side connectors provide ethernet ports, building integrated timing supply clock inputs, fuse alarm panel indications, and shelf identification. The ethernet ports provide differential transmit and receive pairs and may not be bussed together between slots 9 and 10. Clock inputs are connected in parallel to slots 9 and 10 and include differential pairs that are terminated even if a module is not inserted into a slot. The fuse alarm panel indications are a matrix of connections provided to the rear of telecommunications chassis 10 on wire wrap pins. For shelf identification, a memory resides on a back side module that connects to slots 9 and 10 and contains serial numbers and history information for telecommunications chassis 10.

Star bus A 26 and star bus B 28 include 6 independent star buses. The center of one set of three stars is system controller module 12 in slot 9 established by star bus A 26. The center of the other set of three stars is system controller module 12 in slot 10 established by star bus 28. Each of star bus 26 and star bus 28 includes three buses, an X bus, a Y bus, and a Z bus. The X bus supports links from the system controller module slots to each slot in the chassis.

System controller 12 in slot 9 connects two differential pairs of traces (one transmit pair and one receive pair) to each of slots 1 to 8 and 11 to 18. Similarly, system controller 12 in slot 10 connects two differential pair of traces (one transmit pair and one receive pair) to each of slots 1 to 8 and 11 to 18. The Y bus is configured similarly to the X bus. The Z bus is a star connection from each system controller module 12 to each slot. One star emanates from each system controller module 12 slot. The rays of the star may be two pair of LVDS links, one for output and one for input. These links connect devices on each module in a slot to devices on the respective system controller modules 12.

Dual H.110 bus 34 provides an industry standard pulse code modulation (PCM) highway for telecommunications chassis 10. One H.110 bus has its data and control signals connected to slots 1 to 18. The other H.110 bus has its data signals connected to slots 1 to 8 and 11 to 18 with its control signals connected to slots 1 to 18. Signals that are transmitted on either H.110 bus include a frame sync and redundant frame sync signals, a bit clock and a redundant bit clock signals, serial data line signals, network timing reference signals, an enable signal, and a message channel for inter-device communications. The first H.110 bus also includes multi-frame sync signals.

Ethernet bus 32 provides a redundant 10B2 local area network, each with a pair of traces organized as a bus. This bus connects to slots 1 to 18 of telecommunications chassis 10. A redundant clock distribution bus 30 provides a clock signal generated on each system controller module 12 using BLVDS technology. There are four pairs of clock lines with clock signals being synchronous with a system clock and configured in a multi-drop arrangement. Right hand clock signals are generated on system controller module 12 in slot 9 and distributed to slots 10 to 18. Left hand clock signals are generated on system controller module 12 in slot 10 and distributed to slots 1 to 9. Each system controller module 12 in slots 9 and 10 may source the right hand and left hand clock signals.

Figure 4:
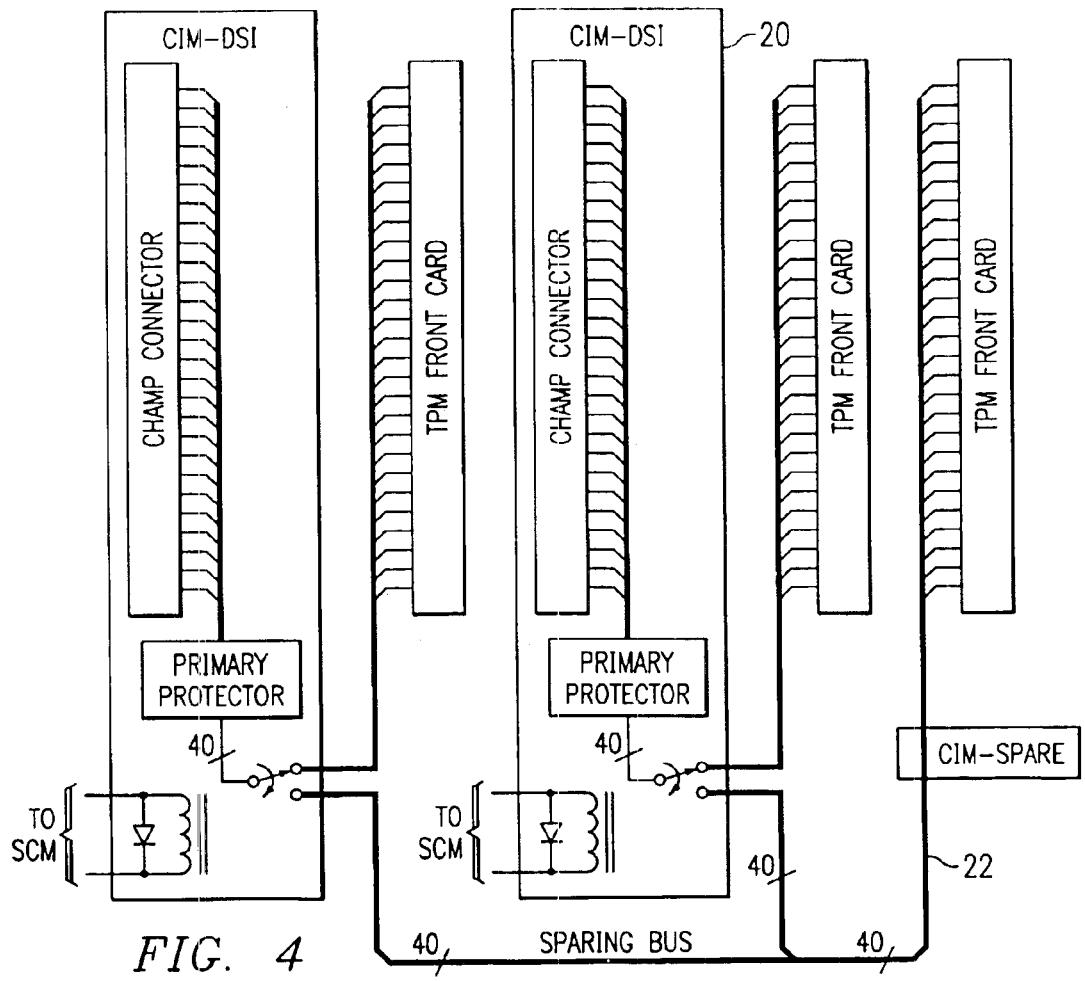
FIG. 4 illustrates a block diagram of a sparing bus provided by the backplane architecture.

FIG. 4 shows an example of T1 sparing bus 22. T1 sparing bus 22 allows for signals to be routed to an operational module in a slot in the event of a module failure in another slot. Cable interface module 20 includes relays that direct T1 lines to modules within telecommunications chassis 10 slots or onto T1 sparing bus 22. The relays are controlled by a single input from system controller module 12. If a module fails, system controller module 12 is responsible for switching the T1 lines to T1 sparing bus 22. T1 sparing bus 22 provides the T1 lines to a spare cable interface module 20 for use by a spare module within a slot of telecommunications chassis 10.

Figures 1, 5A:
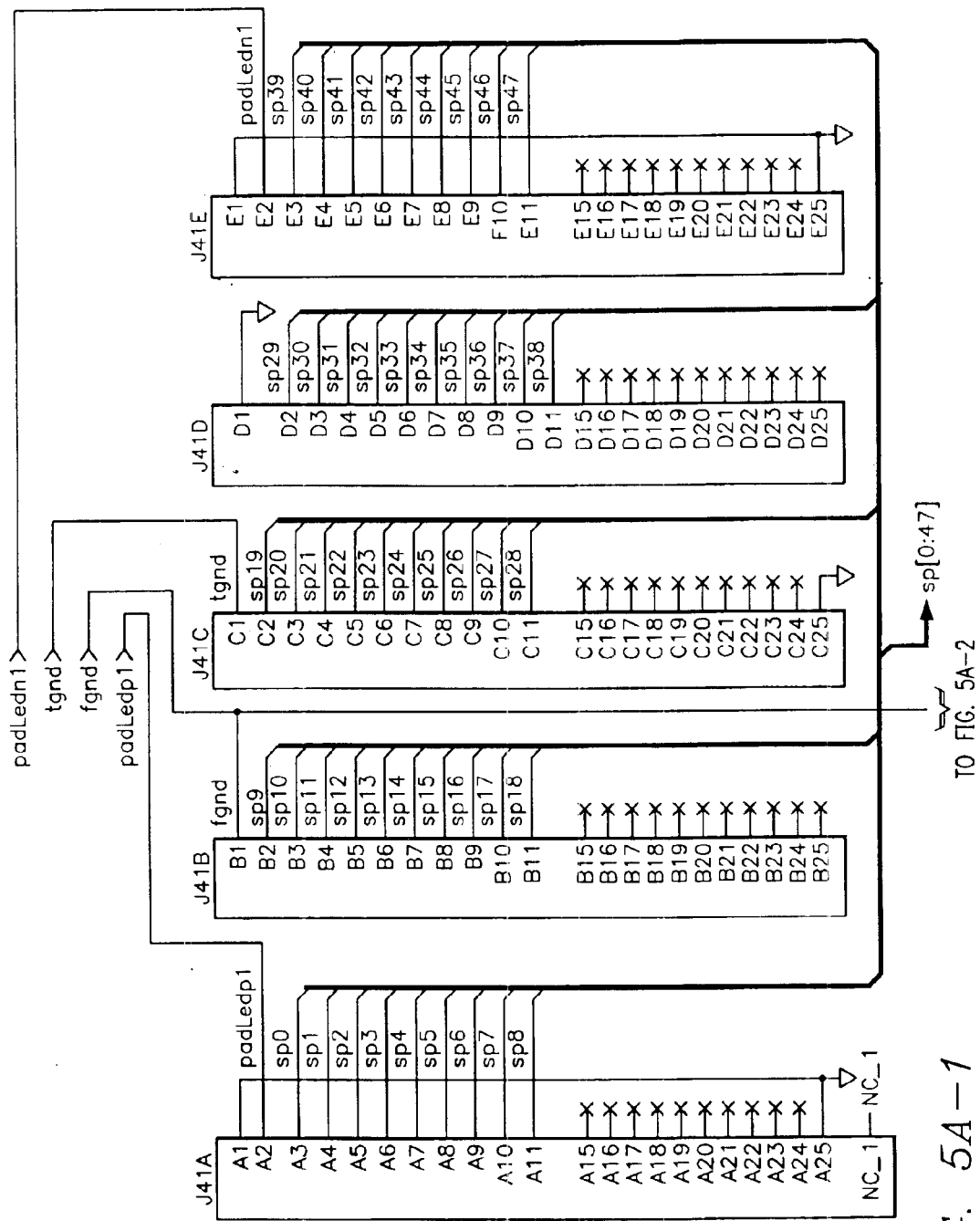
Figures 2, 5A:
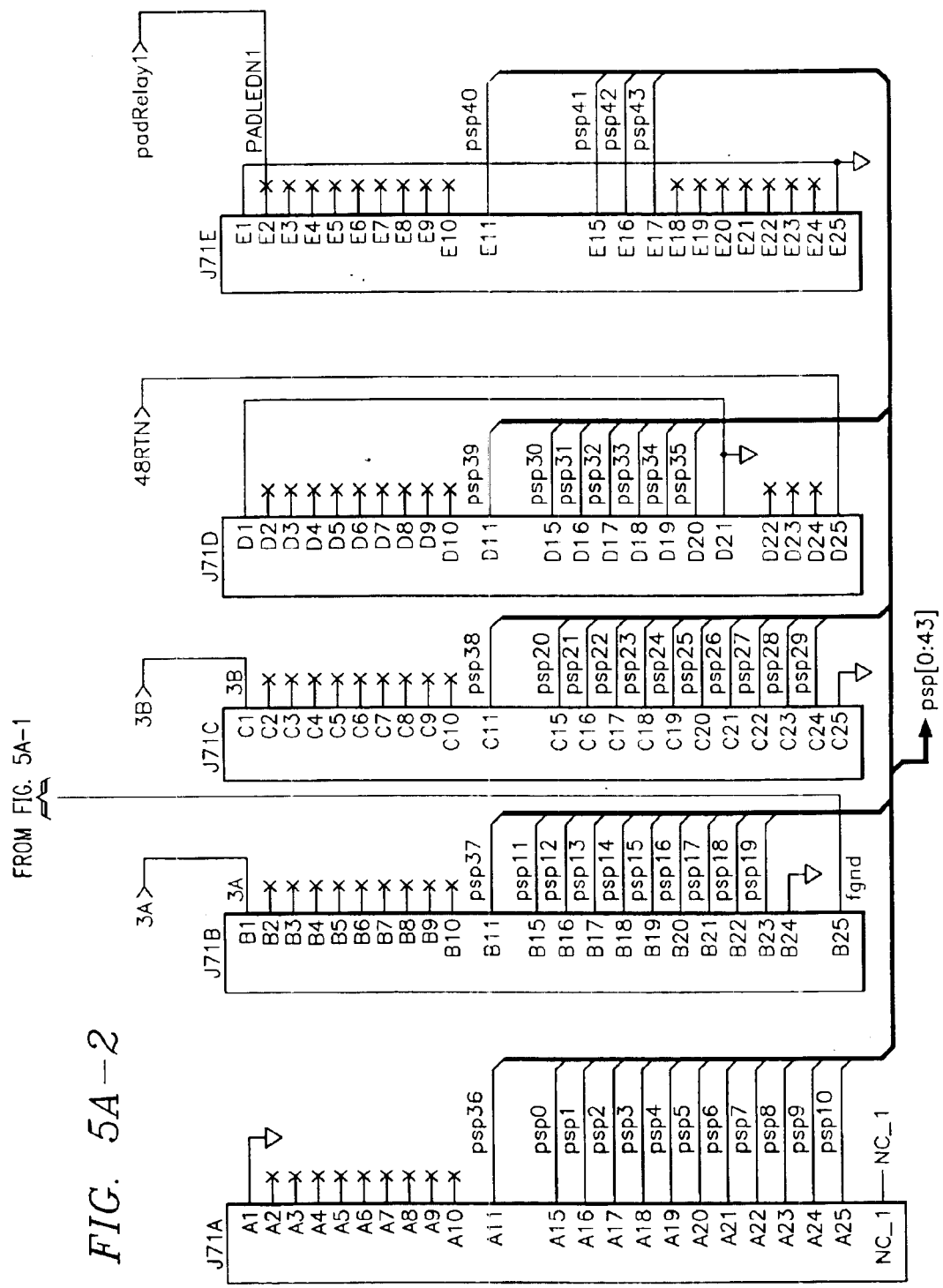
Figures 3, 5B:
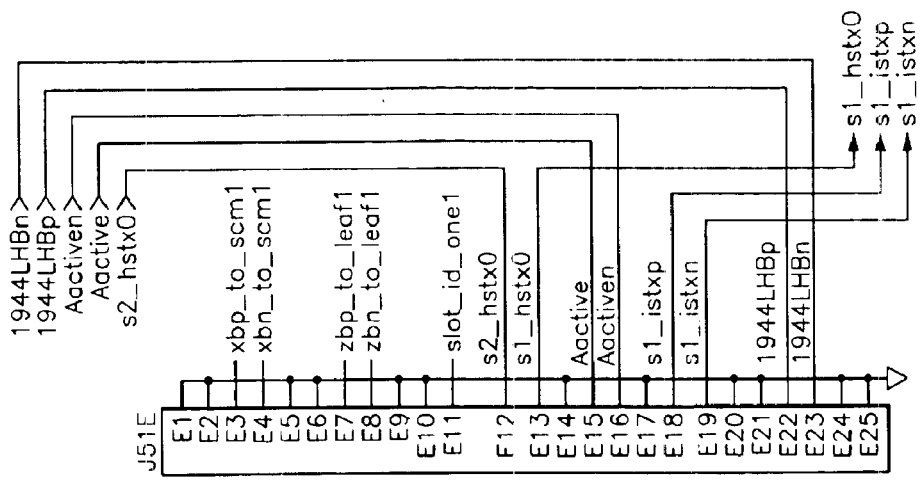
Figures 1, 5B:
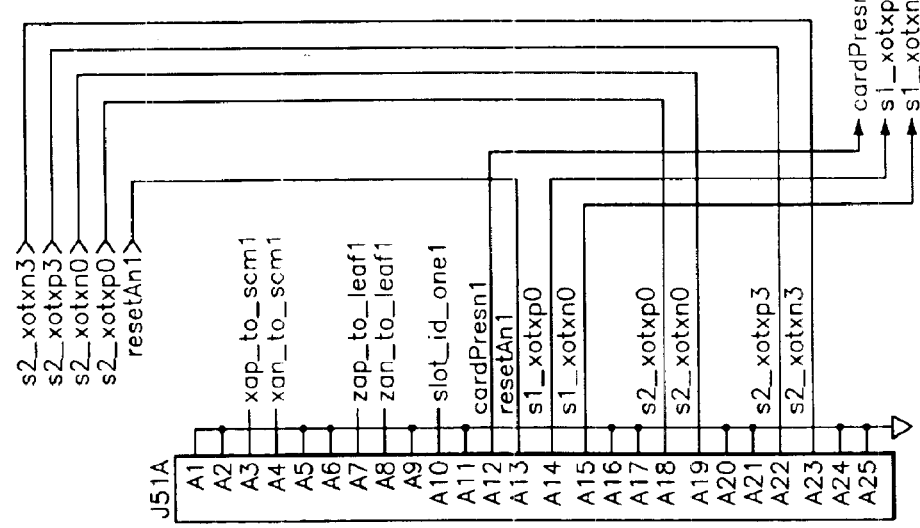
Figures 2, 5B:
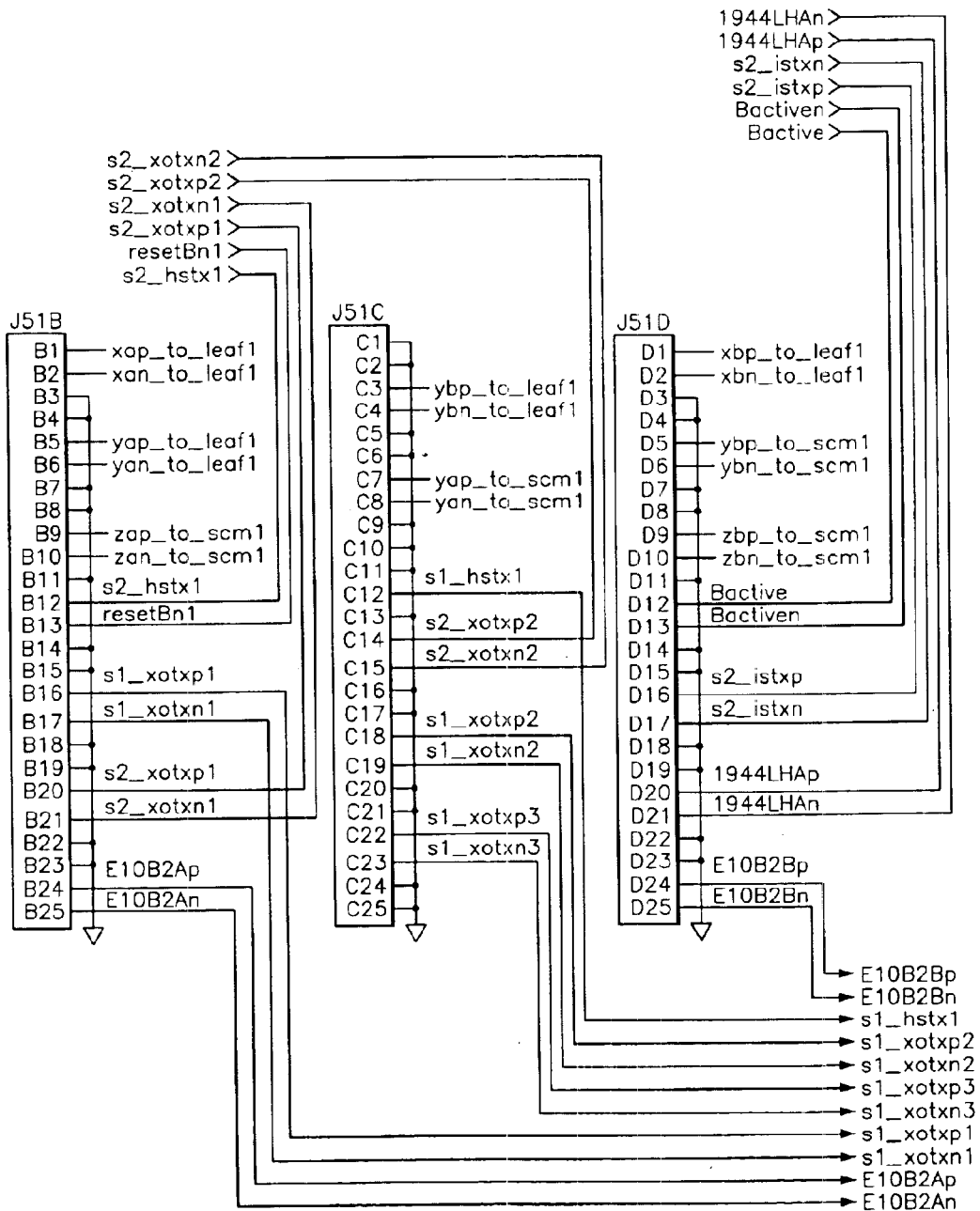
Figures 4, 5B:
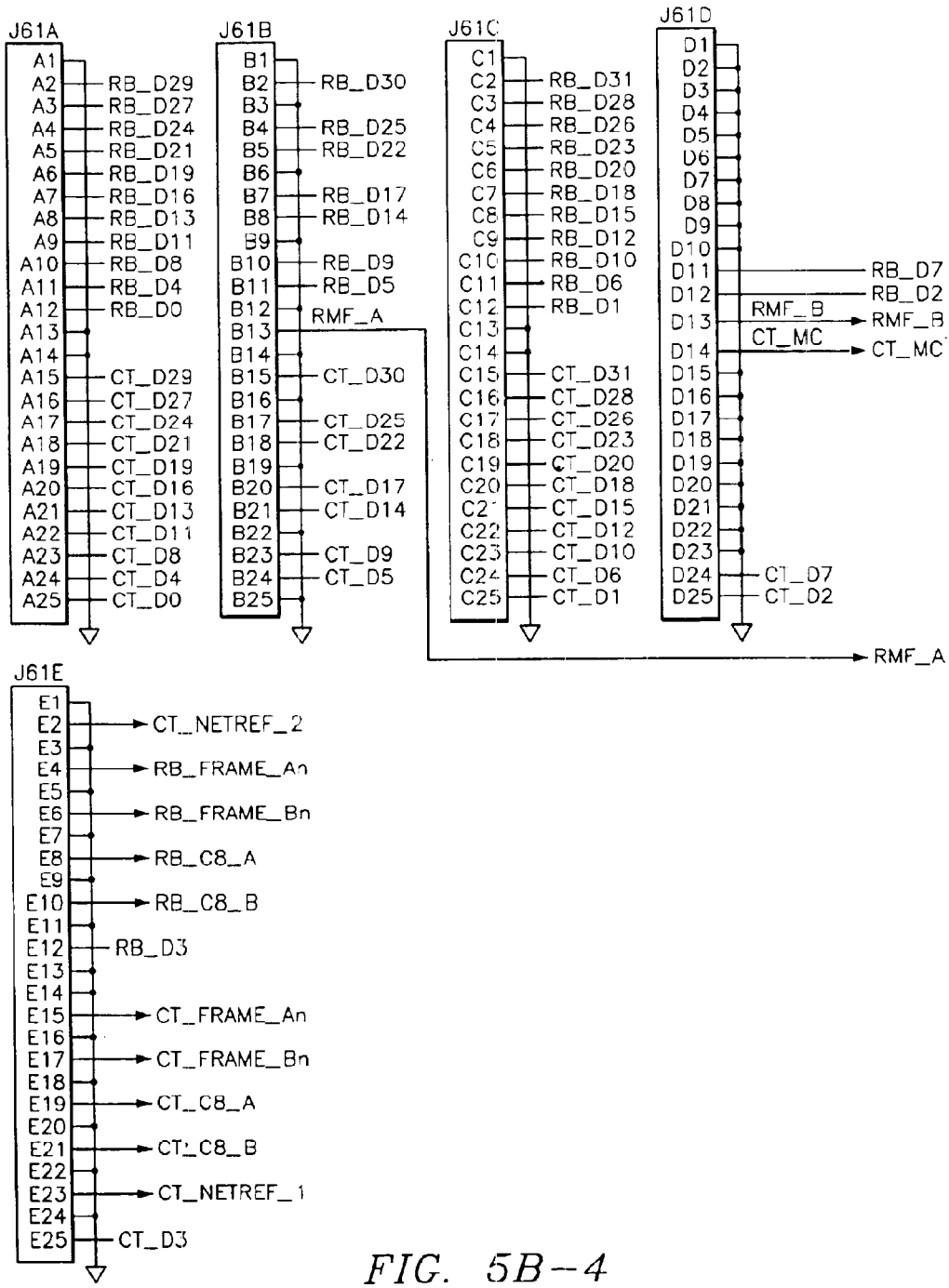
Figures 1, 5C:
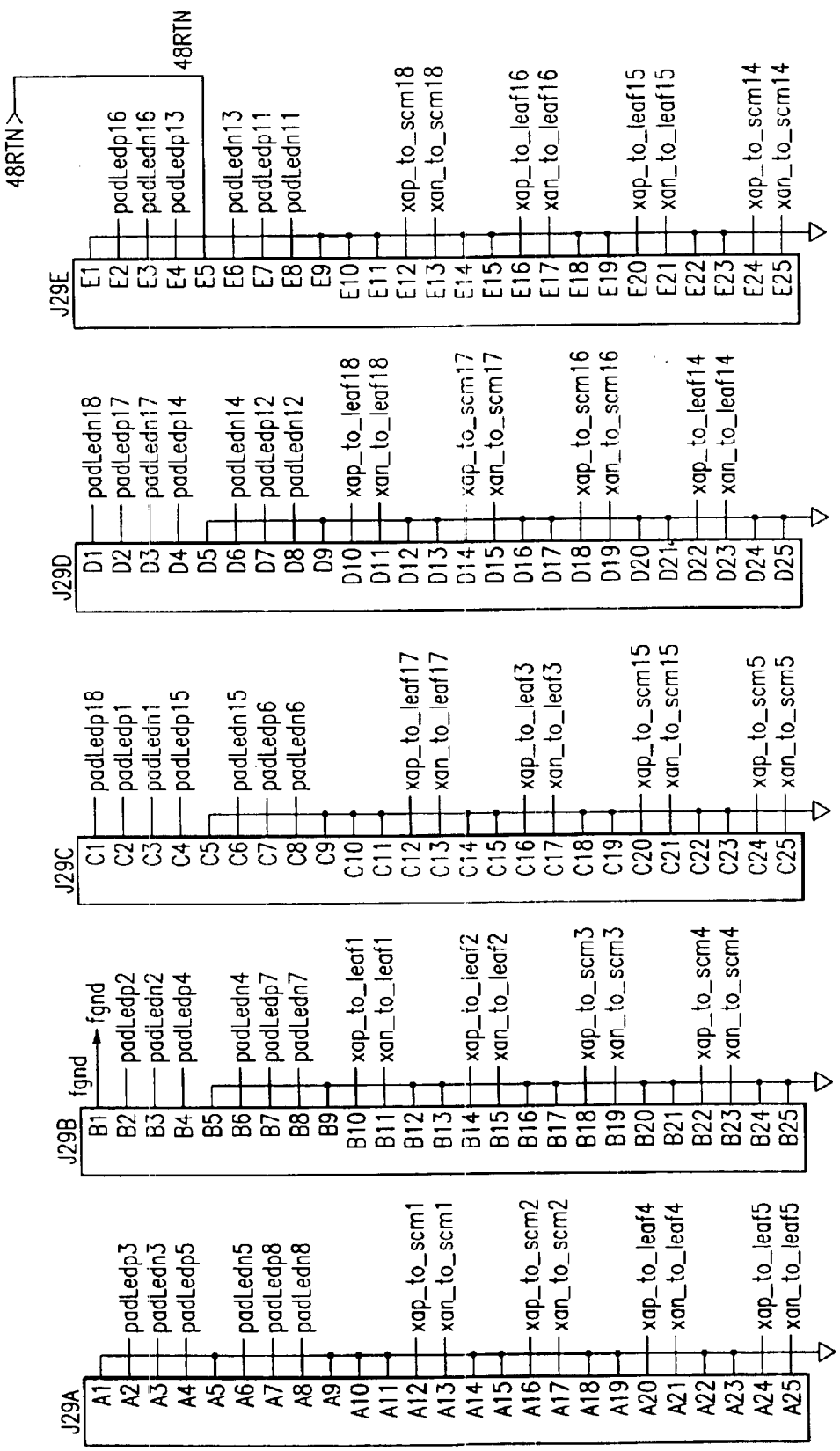
Figures 2, 5C:
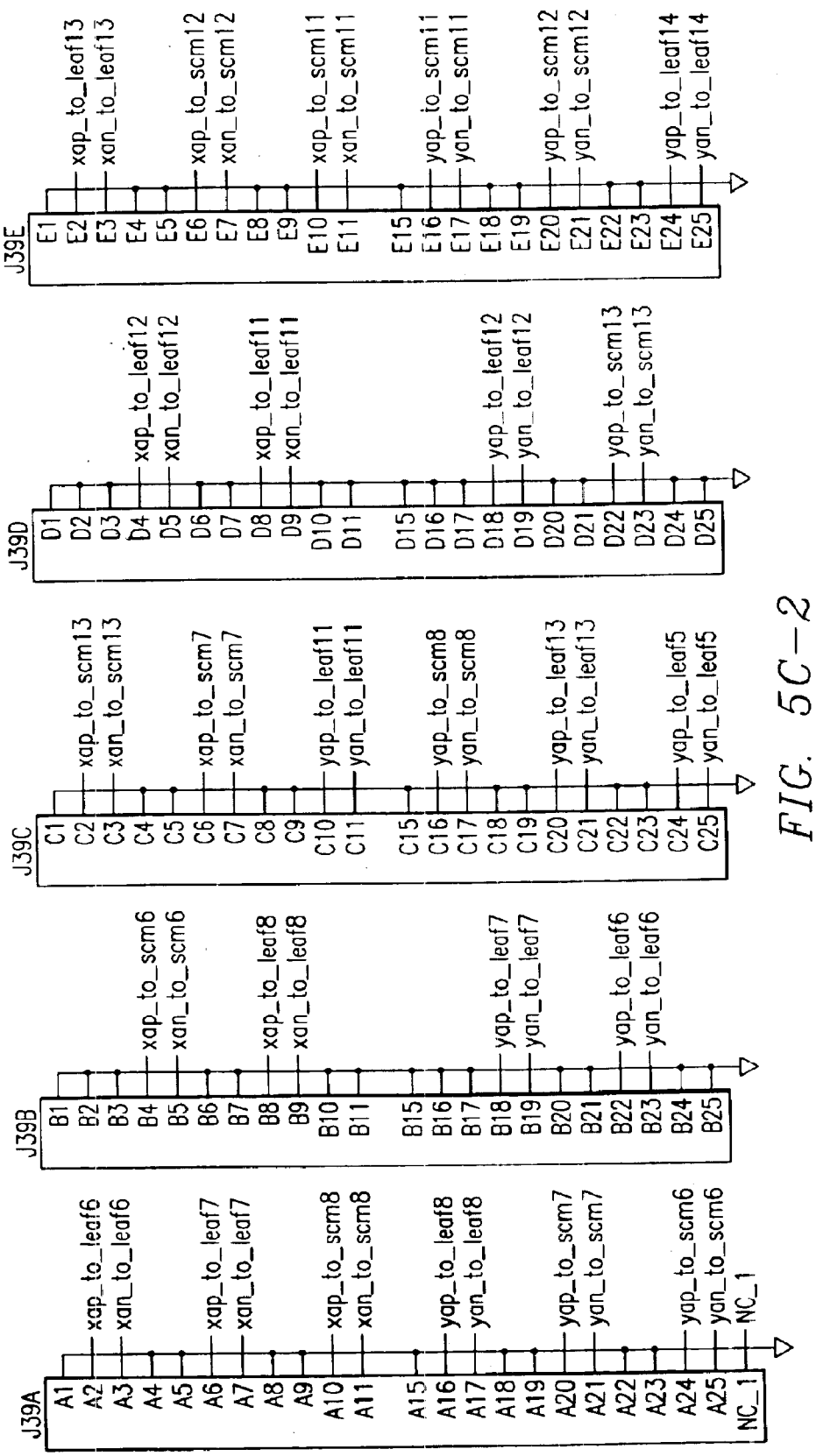
Figures 3, 5C:
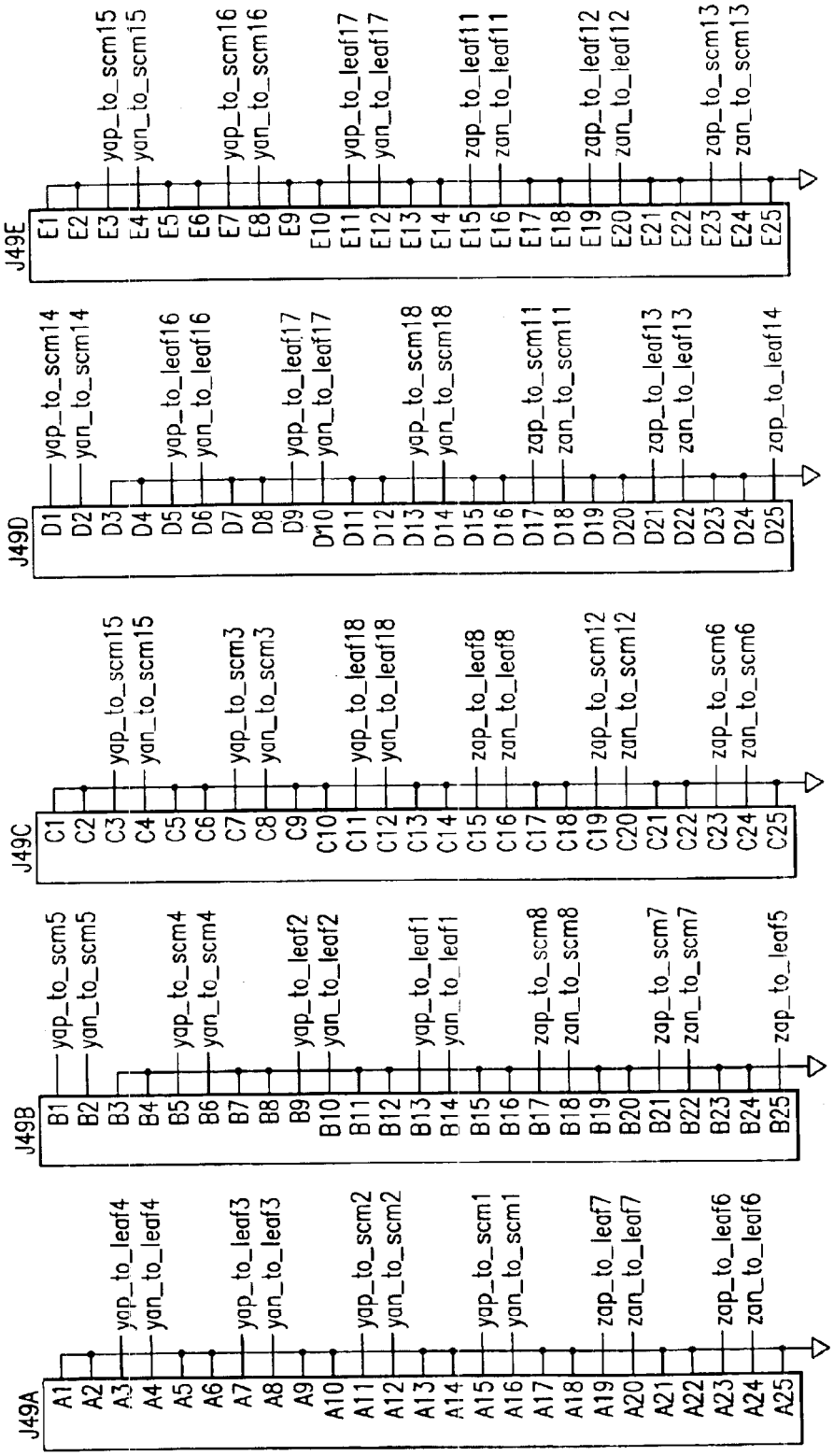
Figures 1, 5D:
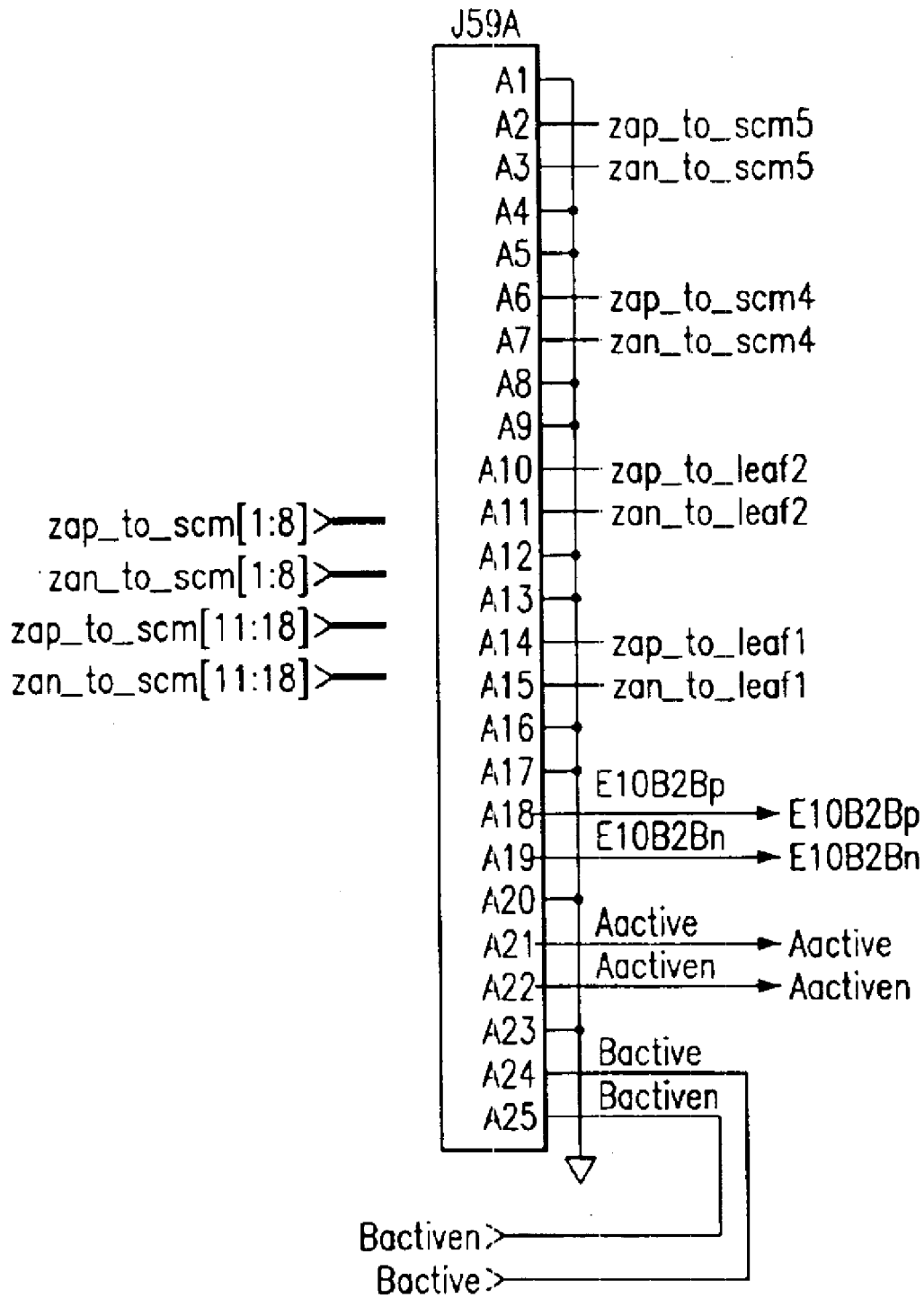
Figures 2, 5D:
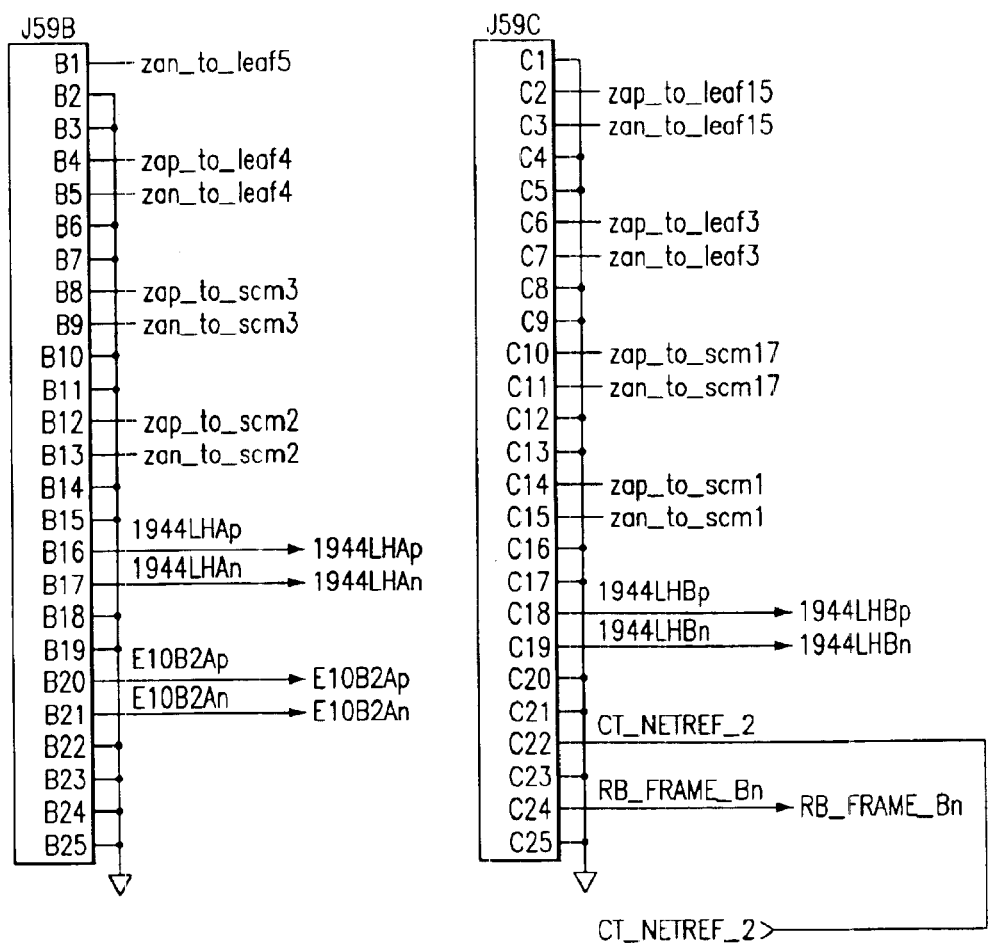
Figures 3, 5D:
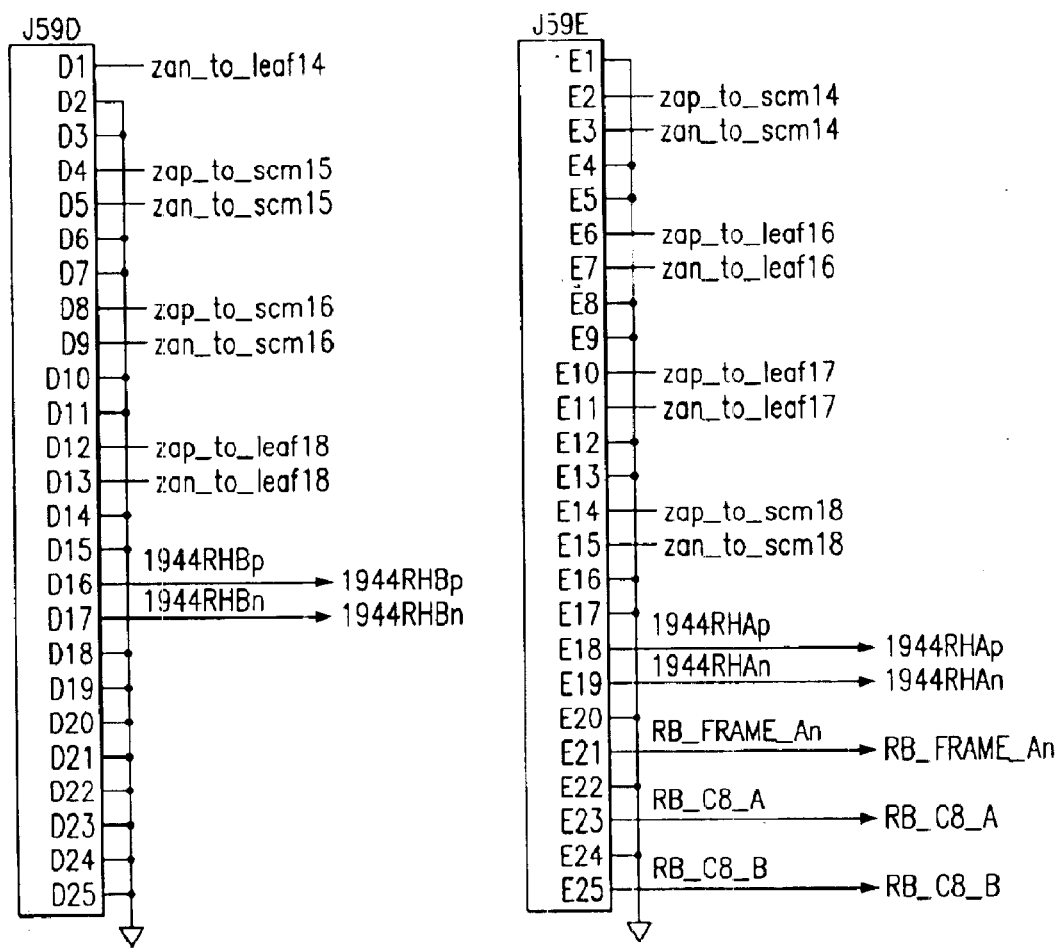
Figures 4, 5D:
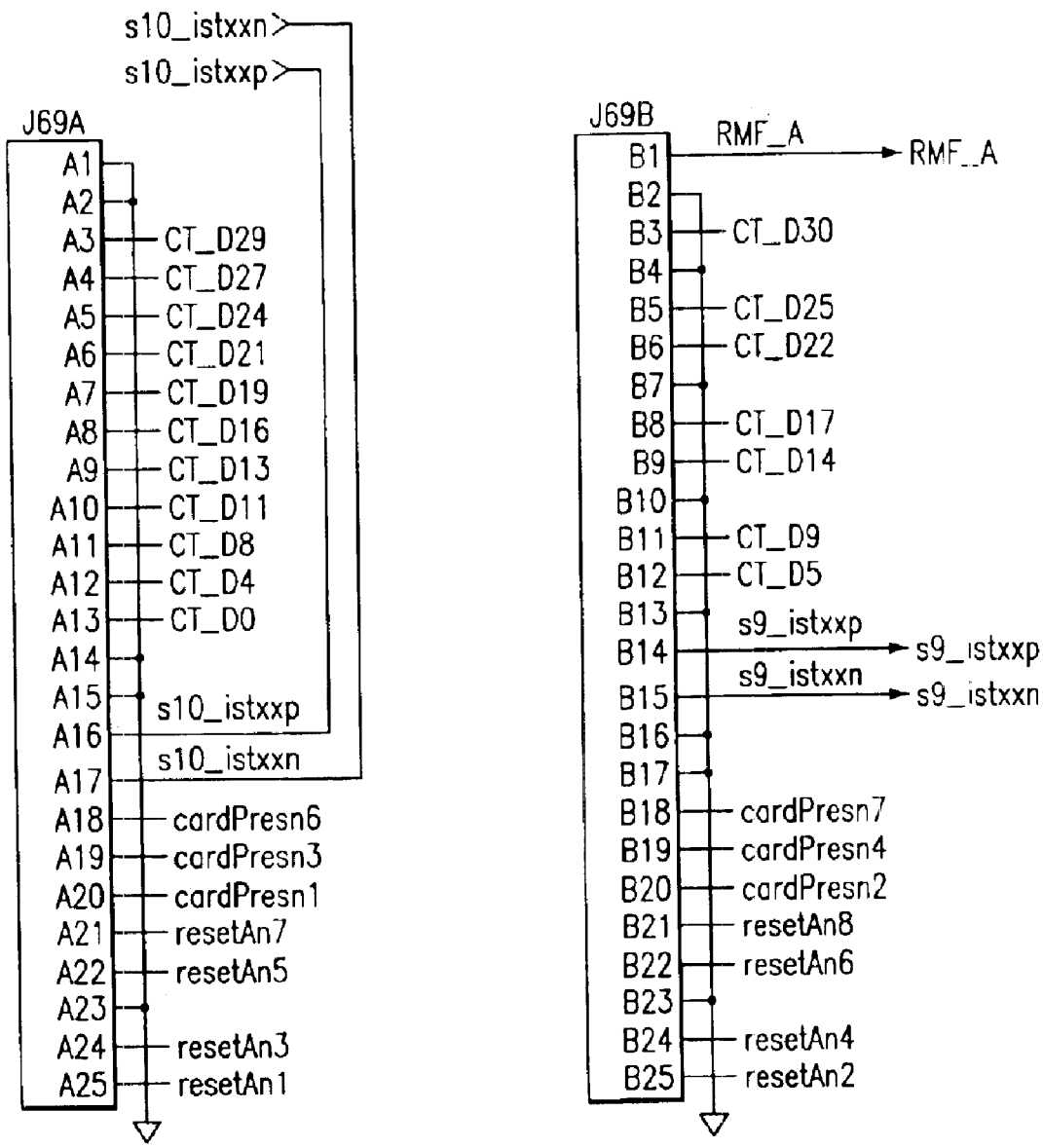
Figures 5, 5D:
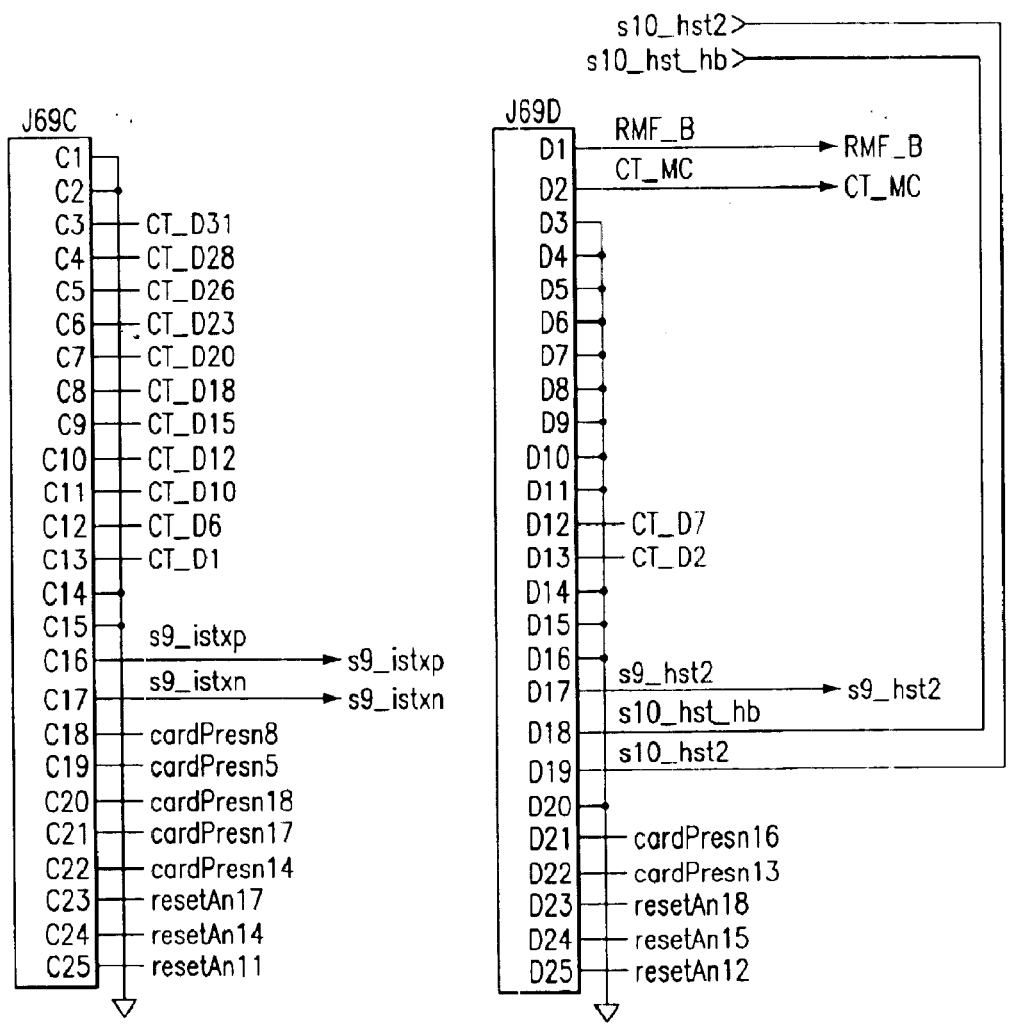
Figures 5, 5D, 6:
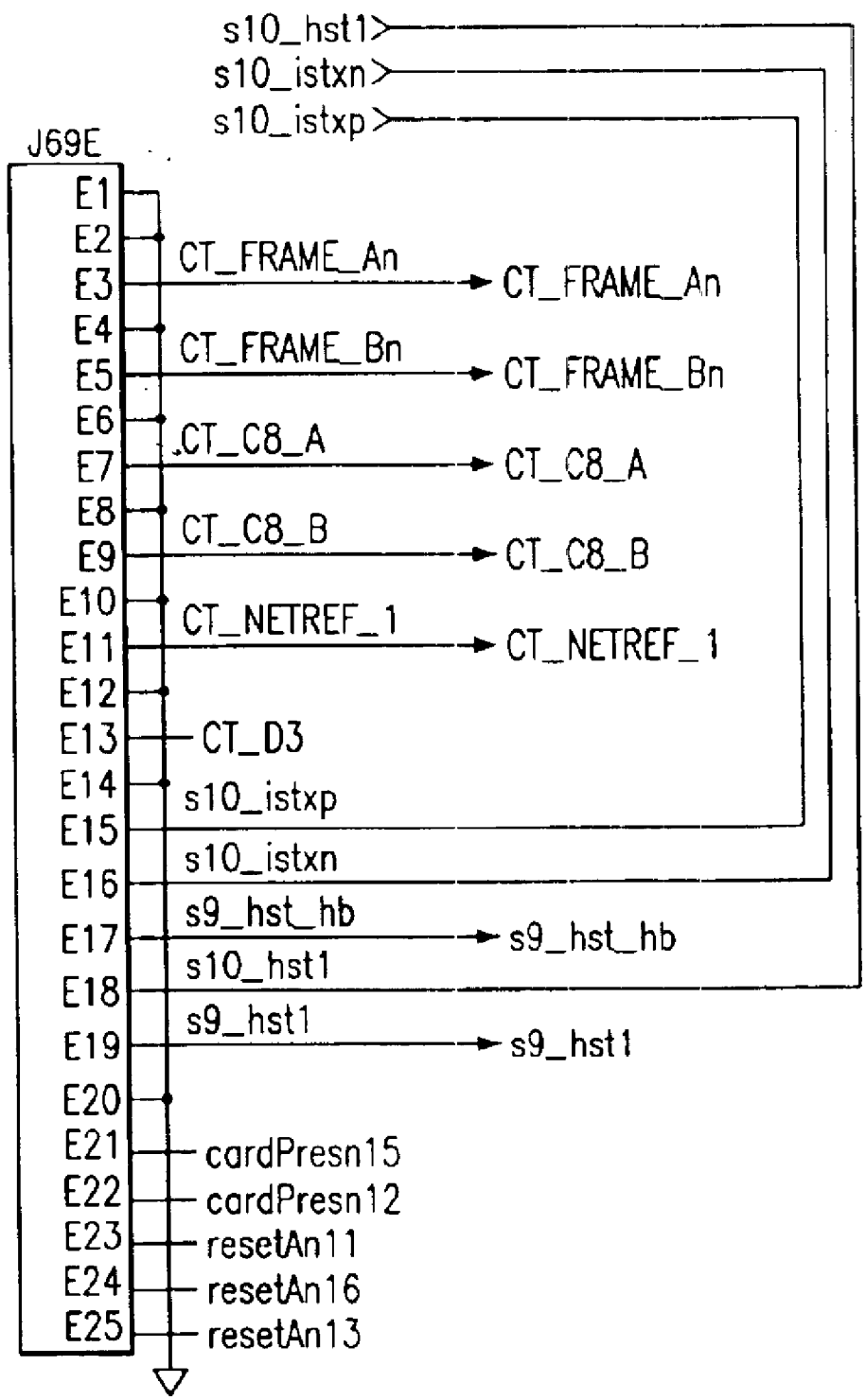
Figure 5E:
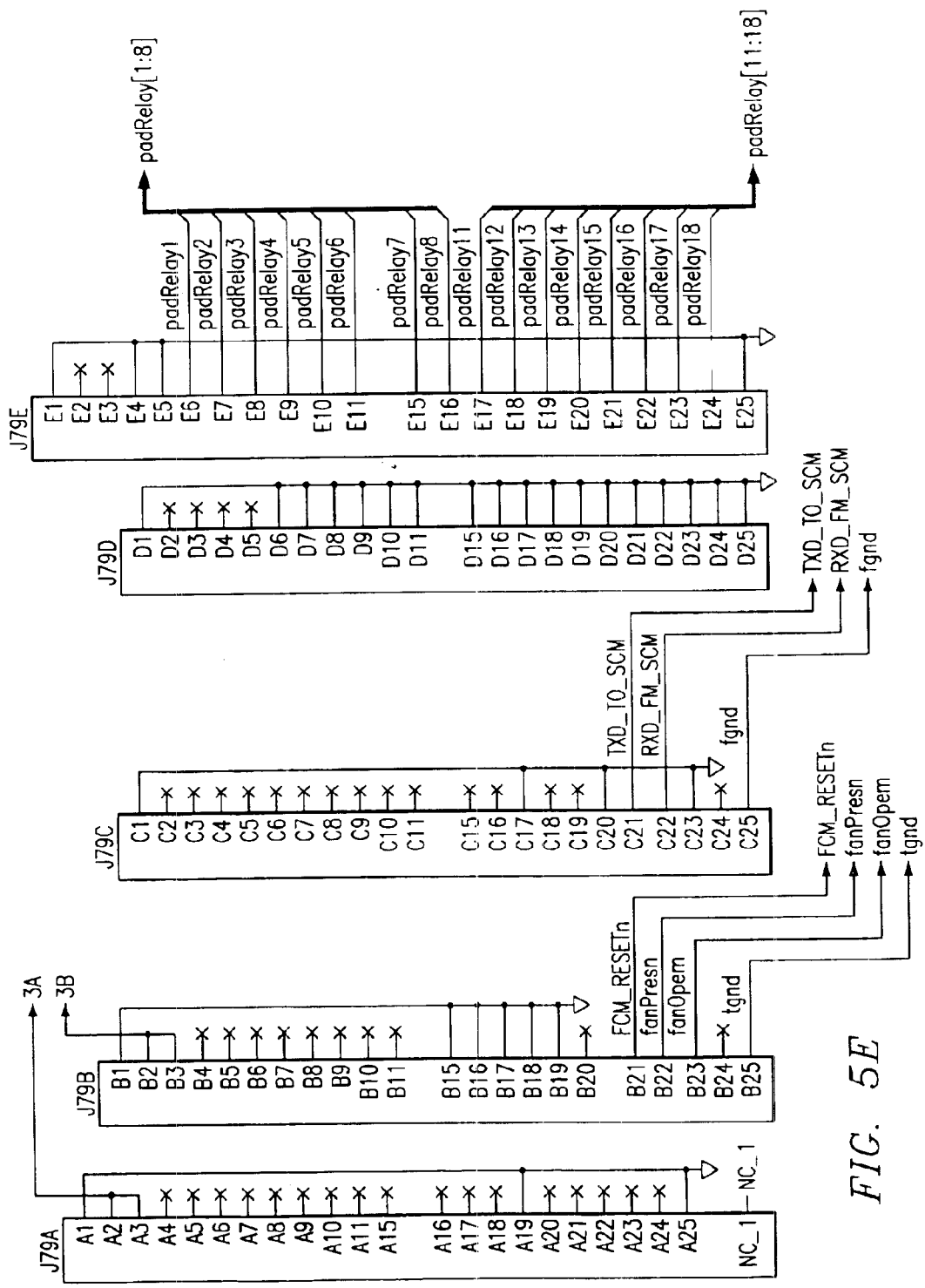
Figure 5F:
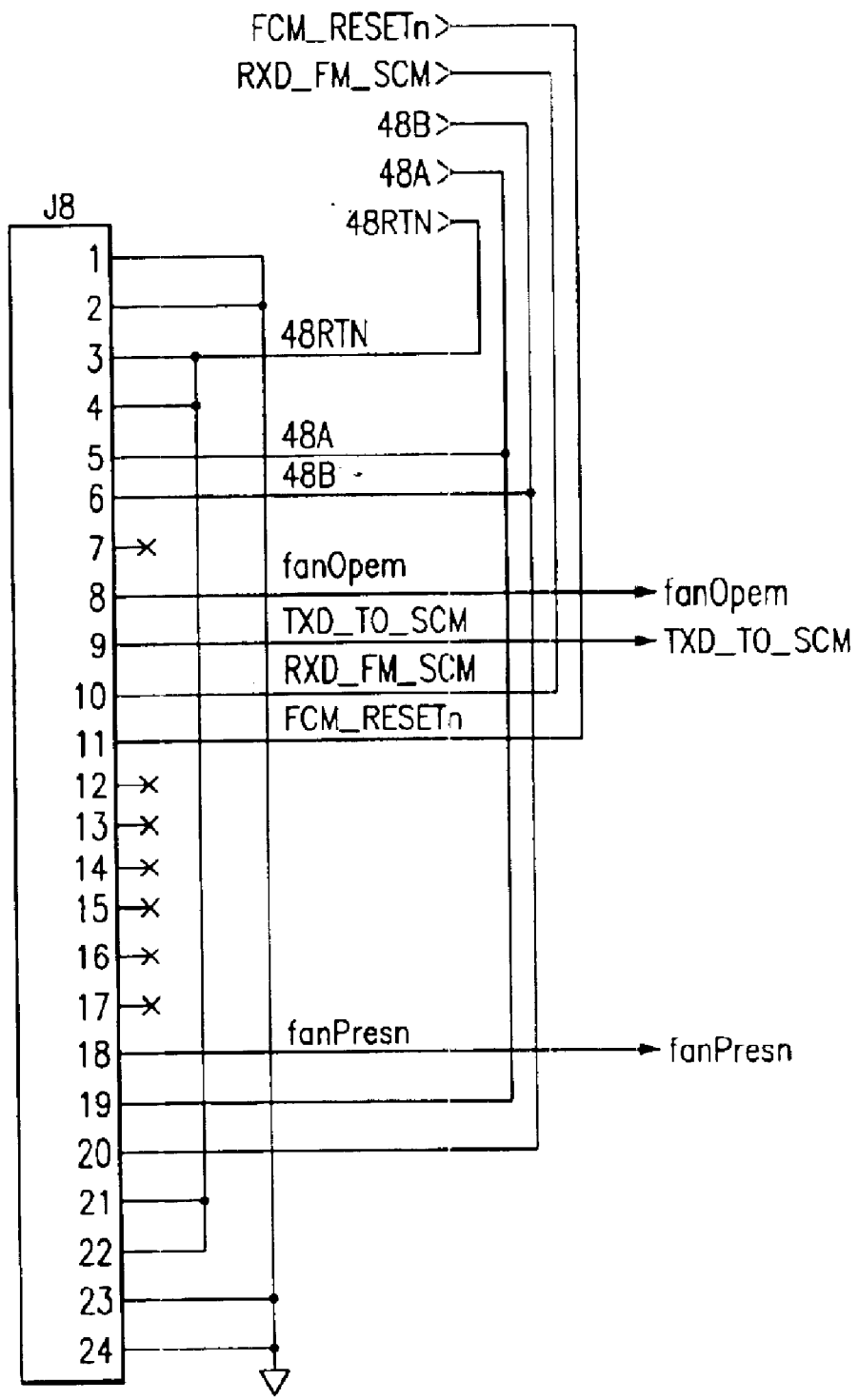
Figures 1, 5G:
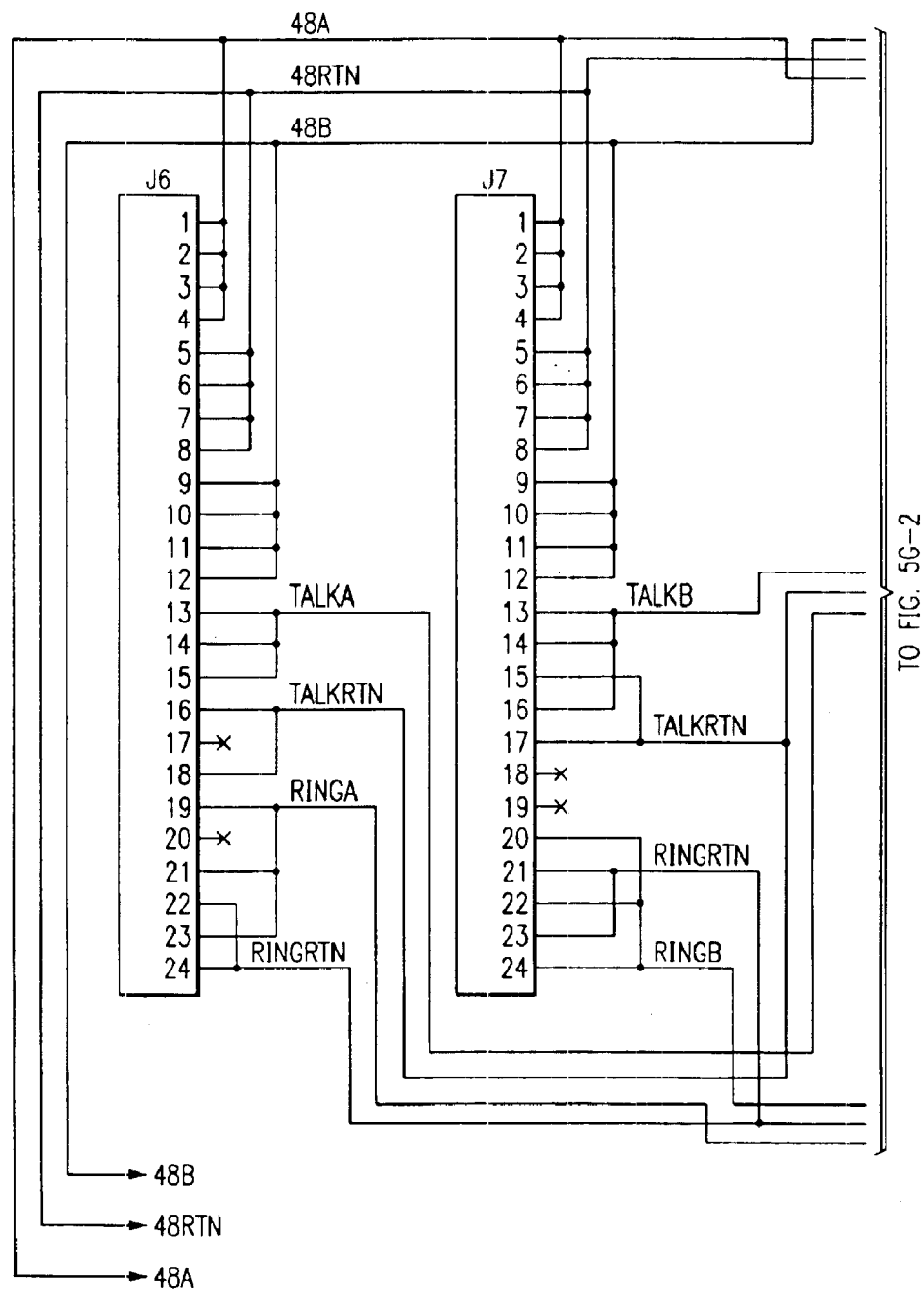
Figures 2, 5G:
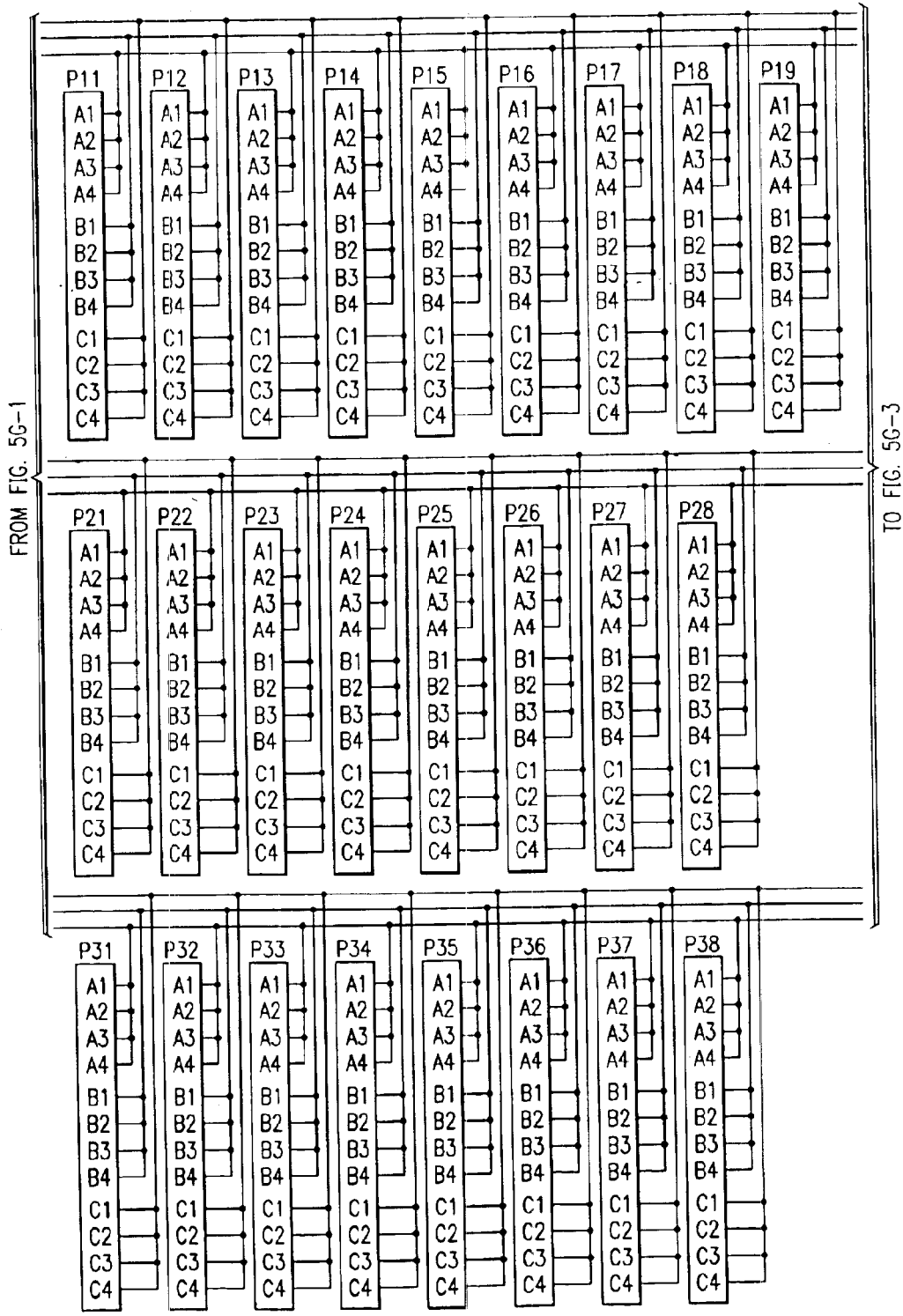
Figures 3, 5G:
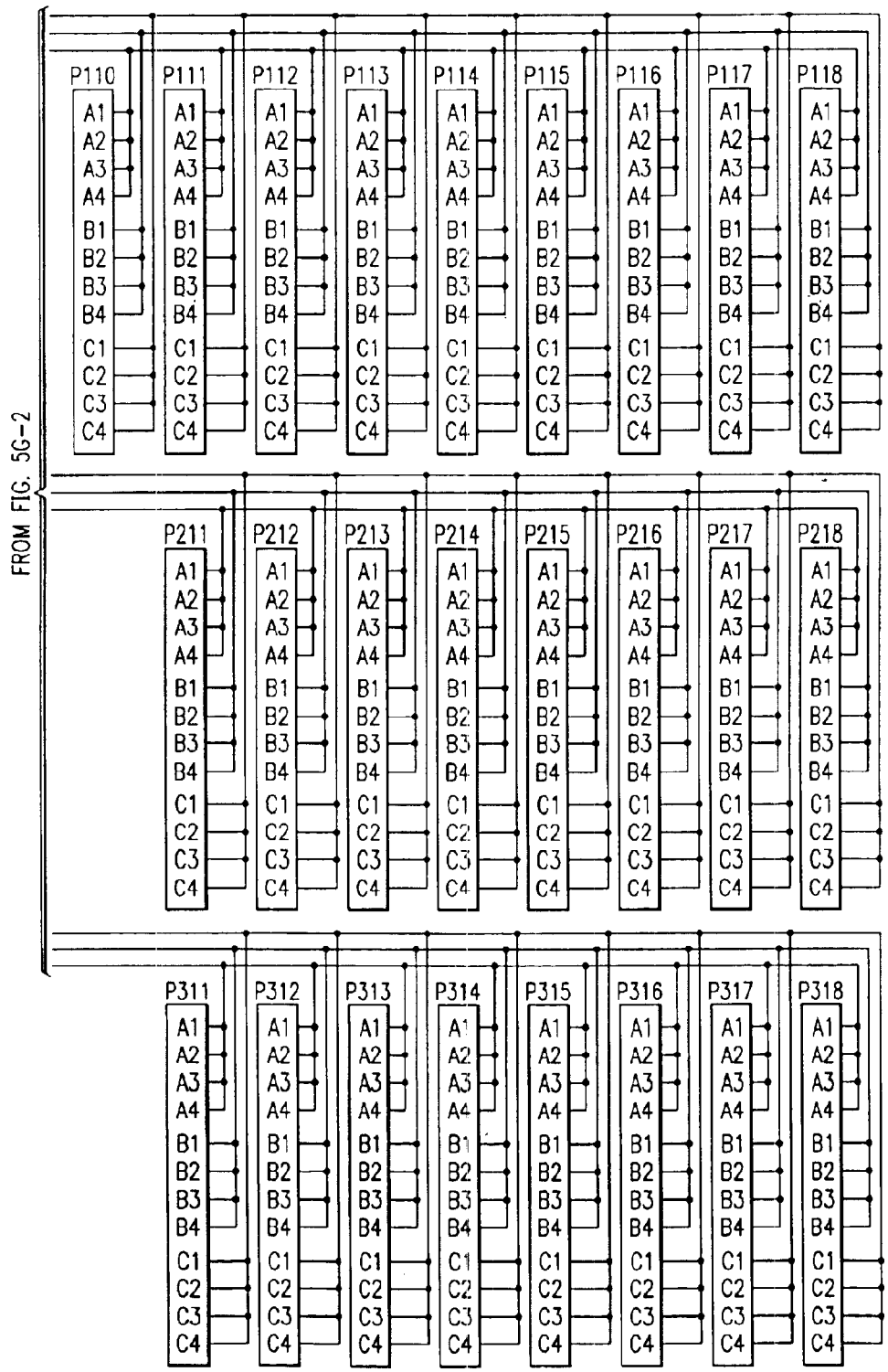
Figures 2, 5H:
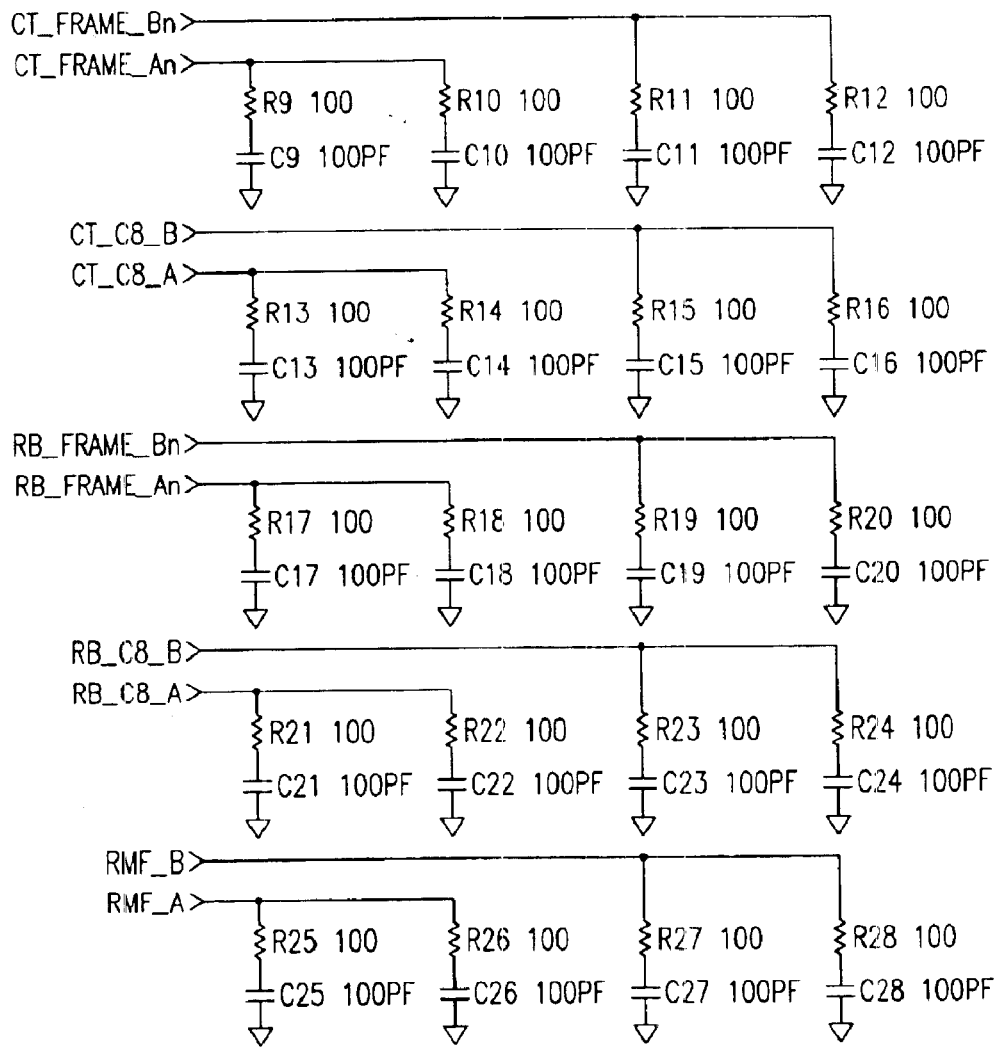
Figure 51:
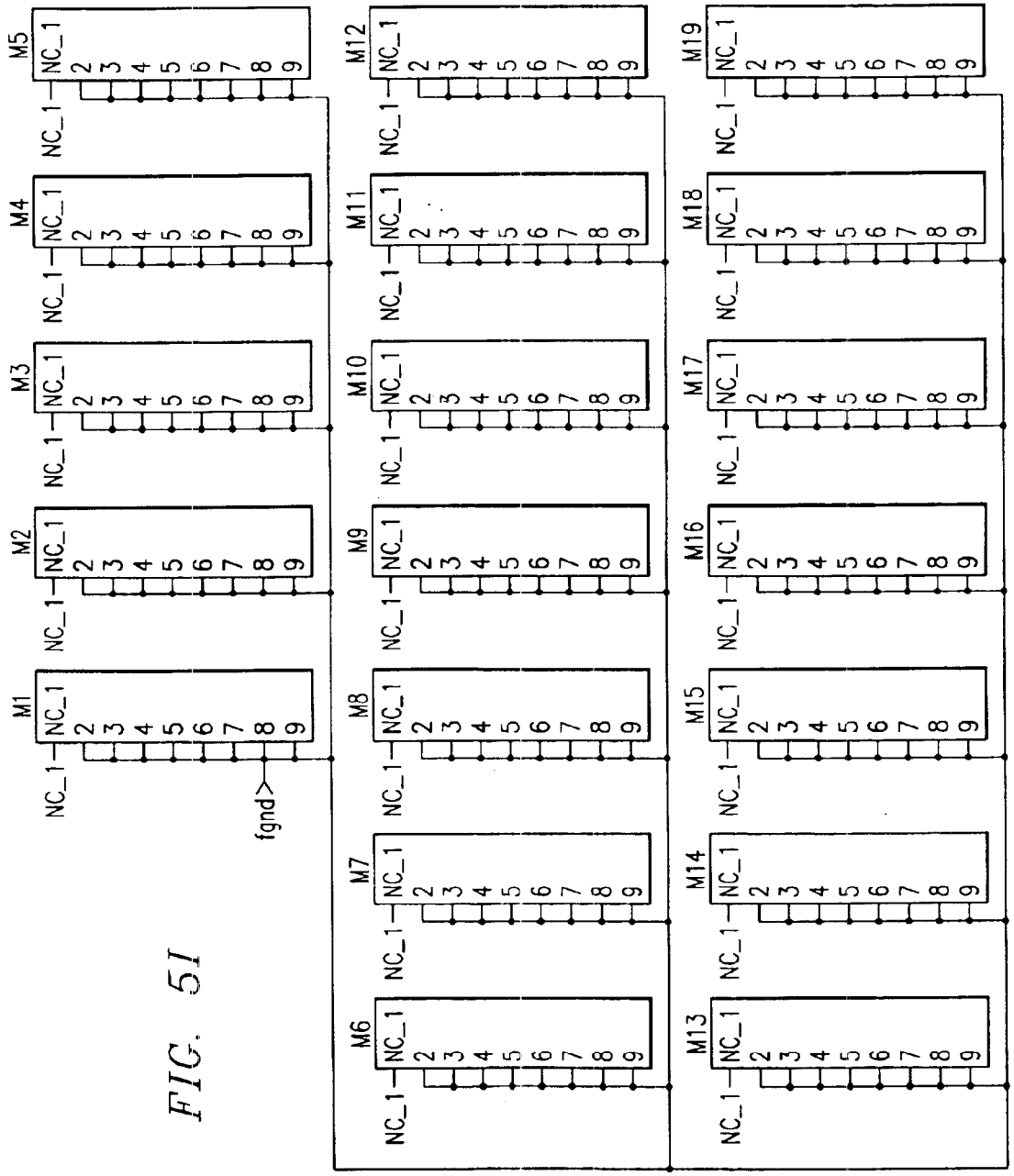

FIGS. 5A–I show the schematic diagrams for backplane 11. FIG. 5A shows the schematic diagram for the top and bottom feedthrough connectors of slots 1–8 and 11–18. FIG. 5B shows a schematic diagram of the middle connectors of slots 1–8 and 11–18. FIG. 5C shows a schematic diagram of the top three connectors for slots 9 and 10. FIG. 5D shows the schematic diagram of the next two connectors of slots 9 and 10. FIG. 5E shows a schematic diagram of the bottom connector of slots 9 and 10. FIG. 5F shows a schematic diagram for fan control of telecommunications chassis 10. FIG. 5G shows a schematic diagram for power distribution across backplane 11. FIG. 5H shows a schematic diagram of a termination scheme for backplane 11. FIG. 5I shows a schematic diagram of frame ground distribution across backplane 11.

Thus, it may be apparent that there has been provided, in accordance with the present invention, a backplane architecture for a telecommunications system chassis that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. A backplane architecture for a telecommunication system chassis, comprising:

a pair of controller slots operable to receive respective controller modules;

a plurality of module slots operable to receive respective telephony modules having different functionalities, each of the pair of controller slots being connected by a plurality of buses to each of the plurality of module slots, wherein any module is operable to be placed into any of the plurality of module slots regardless of its functionality.

2. The backplane architecture of claim 1, wherein one of the plurality of buses is operable to indicate whether a module has been inserted into a particular one of the plurality of module slots.

3. The backplane architecture of claim 1, wherein one of the plurality of buses is operable to provide a sparing capability in the event of a failure in a module.

4. The backplane architecture of claim 1, wherein the pair of controller slots are connected by a controller bus operable to provide communications between controller modules.

5. The backplane architecture of claim 1, wherein a pair of the plurality of module slots are connected by a inter-slot bus operable to provide adjacent module communications.

6. The backplane architecture of claim 1, wherein the plurality of buses include self timed buses not requiring a clock signal.

7. The backplane architecture of claim 1, wherein one of the plurality of buses includes individual reset lines from each controller slot to each module slot, the individual reset lines providing independent resets to any module installed in the plurality of module slots.

8. The backplane architecture of claim 1, wherein the plurality of buses include an ethernet bus.

9. The backplane architecture of claim 1, wherein the plurality of buses include a pair of clock distribution buses.

10. The backplane architecture of claim 1, wherein the plurality of buses include dual H.110 buses.

* * * * *